United States Patent
Ellis

(10) Patent No.: US 9,652,415 B2
(45) Date of Patent: May 16, 2017

(54) ATOMIC NON-VOLATILE MEMORY DATA TRANSFER

(71) Applicant: SanDisk Enterprise IP LLC, Milpitas, CA (US)

(72) Inventor: Robert W. Ellis, Phoenix, AZ (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/596,181

(22) Filed: Jan. 13, 2015

(65) Prior Publication Data

US 2016/0011813 A1 Jan. 14, 2016

Related U.S. Application Data

(60) Provisional application No. 62/022,591, filed on Jul. 9, 2014.

(51) Int. Cl.
*G06F 13/16* (2006.01)
*G06F 3/06* (2006.01)
(Continued)

(52) U.S. Cl.
CPC ........ *G06F 13/1657* (2013.01); *G06F 3/0625* (2013.01); *G06F 3/0647* (2013.01);
(Continued)

(58) Field of Classification Search
CPC ............. G06F 13/1657; G06F 13/1689; G06F 13/1673; G06F 13/1684
See application file for complete search history.

(56) References Cited

U.S. PATENT DOCUMENTS 4,586,167 A * 4/1986 Fujishima ............ G11C 7/1045
365/189.05
5,559,988 A 9/1996 Durante et al.
(Continued)

FOREIGN PATENT DOCUMENTS

EP 0 376 285 A2 7/1990
WO WO 2012/083308 6/2012

OTHER PUBLICATIONS

International Search Report and Written Opinion dated Nov. 18, 2015, received in International Patent Application No. PCT/UW2015/039552 which corresponds to U.S. Appl. No. 14/559,183, 11 pages (Ellis).

(Continued)

*Primary Examiner* — Joseph D Torres
(74) *Attorney, Agent, or Firm* — Morgan, Lewis & Bockius LLP

(57) ABSTRACT

The various implementations described herein include systems, methods and/or devices used to transfer data within a storage device. In one aspect, a method includes reading data from a first non-volatile memory device to a shared bus, where the shared bus couples the first non-volatile memory device to a second non-volatile memory device and to the controller, and where the first non-volatile memory device is on a first die and the second non-volatile memory device is on a second die, distinct from the first die. The method further includes, in conjunction with reading the data from the first non-volatile memory device to the shared bus, generating a data strobe at the first non-volatile memory device; and, in response to receiving the data strobe at the second non-volatile memory device, transferring the data from the shared bus to the second non-volatile memory device.

22 Claims, 9 Drawing Sheets

(51) Int. Cl.
  *G11C 29/52* (2006.01)
  *G06F 11/10* (2006.01)
  *G11C 5/04* (2006.01)
  *G11C 7/22* (2006.01)
  *G11C 29/04* (2006.01)

(52) U.S. Cl.
  CPC .......... *G06F 3/0658* (2013.01); *G06F 3/0688* (2013.01); *G06F 11/1048* (2013.01); *G06F 13/1673* (2013.01); *G06F 13/1684* (2013.01); *G06F 13/1689* (2013.01); *G11C 29/52* (2013.01); *G11C 5/04* (2013.01); *G11C 7/222* (2013.01); *G11C 2029/0411* (2013.01)

(56) References Cited

U.S. PATENT DOCUMENTS

| | | | |
|---|---|---|---|
| 5,909,559 A * | 6/1999 | So | G06F 13/4018 710/307 |
| 6,247,136 B1 * | 6/2001 | MacWilliams | G06F 12/0802 710/58 |
| 6,292,410 B1 * | 9/2001 | Yi | G11C 7/1051 365/189.05 |
| 6,401,213 B1 * | 6/2002 | Jeddeloh | G06F 5/06 713/401 |
| 6,449,709 B1 * | 9/2002 | Gates | G06F 9/30043 710/310 |
| 7,969,809 B2 | 6/2011 | Ben-Rubi | |
| 8,010,738 B1 | 8/2011 | Chilton et al. | |
| 8,122,202 B2 * | 2/2012 | Gillingham | G06F 13/1678 711/149 |
| 8,213,255 B2 | 7/2012 | Hemink et al. | |
| 8,255,618 B1 | 8/2012 | Borchers et al. | |
| 8,321,627 B1 | 11/2012 | Norrie et al. | |
| 8,429,498 B1 | 4/2013 | Anholt et al. | |
| 8,479,080 B1 | 7/2013 | Shalvi et al. | |
| 8,539,139 B1 | 9/2013 | Morris | |
| 8,595,590 B1 | 11/2013 | Vojcic et al. | |
| 8,775,720 B1 | 7/2014 | Meyer et al. | |
| 8,825,967 B2 * | 9/2014 | Hong Beom | G06F 13/1668 711/154 |
| 8,874,836 B1 | 10/2014 | Hayes et al. | |
| 8,886,872 B1 | 11/2014 | Norrie | |
| 8,924,661 B1 | 12/2014 | Shachar et al. | |
| 8,984,376 B1 | 3/2015 | Norrie | |
| 9,128,825 B1 | 9/2015 | Albrecht et al. | |
| 9,170,876 B1 | 10/2015 | Bates et al. | |
| 9,176,971 B2 | 11/2015 | Shapiro | |
| 9,214,965 B2 | 12/2015 | Fitzpatrick et al. | |
| 2003/0115403 A1 * | 6/2003 | Bouchard | G06F 13/1647 711/5 |
| 2003/0122834 A1 | 7/2003 | Mastronarde et al. | |
| 2004/0117441 A1 | 6/2004 | Liu et al. | |
| 2005/0144361 A1 | 6/2005 | Gonzalez et al. | |
| 2005/0248992 A1 | 11/2005 | Hwang et al. | |
| 2007/0002629 A1 | 1/2007 | Lee et al. | |
| 2007/0156998 A1 | 7/2007 | Gorobets | |
| 2007/0233937 A1 * | 10/2007 | Coulson | G06F 12/0866 711/103 |
| 2008/0140914 A1 * | 6/2008 | Jeon | G06F 13/1673 711/103 |
| 2008/0147994 A1 | 6/2008 | Jeong et al. | |
| 2008/0235466 A1 | 9/2008 | Traister | |
| 2008/0235480 A1 | 9/2008 | Traister | |
| 2008/0295094 A1 | 11/2008 | Korupolu et al. | |
| 2009/0168525 A1 * | 7/2009 | Olbrich | G06F 13/1657 365/185.11 |
| 2009/0177943 A1 | 7/2009 | Silvus et al. | |
| 2009/0222627 A1 | 9/2009 | Reid | |
| 2009/0282191 A1 | 11/2009 | Depta | |
| 2010/0005217 A1 * | 1/2010 | Jeddeloh | G11C 11/4093 711/1 |
| 2010/0014364 A1 * | 1/2010 | Laberge | G11C 5/02 365/193 |
| 2010/0082879 A1 | 4/2010 | McKean et al. | |
| 2010/0165730 A1 | 7/2010 | Sommer et al. | |
| 2010/0174845 A1 | 7/2010 | Gorobets et al. | |
| 2010/0174853 A1 | 7/2010 | Lee et al. | |
| 2010/0220509 A1 | 9/2010 | Sokolov et al. | |
| 2010/0250874 A1 | 9/2010 | Farrell et al. | |
| 2011/0113204 A1 | 5/2011 | Henriksson et al. | |
| 2011/0138100 A1 | 6/2011 | Sinclair | |
| 2011/0235434 A1 | 9/2011 | Byom et al. | |
| 2011/0252215 A1 | 10/2011 | Franceschini et al. | |
| 2011/0264851 A1 * | 10/2011 | Jeon | G06F 13/1689 711/103 |
| 2012/0030408 A1 | 2/2012 | Flynn et al. | |
| 2012/0047317 A1 | 2/2012 | Yoon et al. | |
| 2012/0159070 A1 | 6/2012 | Baderdinni et al. | |
| 2012/0198129 A1 | 8/2012 | Van Aken et al. | |
| 2012/0224425 A1 | 9/2012 | Fai et al. | |
| 2012/0278530 A1 | 11/2012 | Ebsen | |
| 2012/0324180 A1 | 12/2012 | Asnaashari et al. | |
| 2013/0007380 A1 | 1/2013 | Seekins et al. | |
| 2013/0070507 A1 * | 3/2013 | Yoon | G11C 7/1084 365/51 |
| 2013/0111112 A1 | 5/2013 | Jeong et al. | |
| 2013/0111289 A1 | 5/2013 | Zhang et al. | |
| 2013/0111290 A1 | 5/2013 | Zhang et al. | |
| 2013/0132650 A1 | 5/2013 | Choi et al. | |
| 2013/0182506 A1 | 7/2013 | Melik-Martirosian | |
| 2013/0219106 A1 | 8/2013 | Vogan et al. | |
| 2013/0232290 A1 | 9/2013 | Ish et al. | |
| 2013/0254498 A1 | 9/2013 | Adachi et al. | |
| 2013/0262745 A1 | 10/2013 | Lin et al. | |
| 2013/0297894 A1 | 11/2013 | Cohen et al. | |
| 2013/0346805 A1 | 12/2013 | Sprouse et al. | |
| 2014/0006688 A1 | 1/2014 | Yu et al. | |
| 2014/0013026 A1 | 1/2014 | Venkata et al. | |
| 2014/0047170 A1 | 2/2014 | Cohen et al. | |
| 2014/0075100 A1 | 3/2014 | Kaneko et al. | |
| 2014/0143637 A1 | 5/2014 | Cohen et al. | |
| 2014/0173239 A1 | 6/2014 | Schushan | |
| 2014/0229655 A1 | 8/2014 | Goss et al. | |
| 2014/0229656 A1 | 8/2014 | Goss et al. | |
| 2014/0241071 A1 | 8/2014 | Goss et al. | |
| 2014/0244897 A1 | 8/2014 | Goss et al. | |
| 2014/0258598 A1 | 9/2014 | Canepa et al. | |
| 2014/0281833 A1 | 9/2014 | Kroeger et al. | |
| 2014/0310241 A1 | 10/2014 | Goyen | |
| 2014/0379988 A1 | 12/2014 | Lyakhovitskiy et al. | |
| 2015/0067172 A1 | 3/2015 | Ashokan et al. | |
| 2015/0074487 A1 | 3/2015 | Patapoutian et al. | |
| 2015/0095558 A1 | 4/2015 | Kim et al. | |
| 2015/0113206 A1 | 4/2015 | Fitzpatrick et al. | |
| 2015/0186278 A1 | 7/2015 | Jayakumar et al. | |
| 2015/0234612 A1 | 8/2015 | Himelstein et al. | |
| 2015/0261473 A1 | 9/2015 | Matsuyama et al. | |
| 2015/0262632 A1 | 9/2015 | Shelton et al. | |
| 2015/0301749 A1 | 10/2015 | Seo et al. | |
| 2015/0331627 A1 | 11/2015 | Kwak | |
| 2016/0026386 A1 | 1/2016 | Ellis et al. | |
| 2016/0034194 A1 | 2/2016 | Brokhman et al. | |
| 2016/0062699 A1 | 3/2016 | Samuels et al. | |
| 2016/0070493 A1 | 3/2016 | Oh et al. | |
| 2016/0071612 A1 | 3/2016 | Takizawa et al. | |
| 2016/0117099 A1 | 4/2016 | Prins et al. | |
| 2016/0117102 A1 | 4/2016 | Hong et al. | |
| 2016/0117105 A1 | 4/2016 | Thangaraj et al. | |
| 2016/0117252 A1 | 4/2016 | Thangaraj et al. | |
| 2016/0170671 A1 | 6/2016 | Huang | |
| 2016/0170831 A1 | 6/2016 | Lesatre et al. | |
| 2016/0179403 A1 | 6/2016 | Kurotsuchi et al. | |
| 2016/0210060 A1 | 7/2016 | Dreyer | |
| 2016/0299689 A1 | 10/2016 | Kim et al. | |
| 2016/0299699 A1 | 10/2016 | Vanaraj et al. | |
| 2016/0299704 A1 | 10/2016 | Vanaraj et al. | |
| 2016/0299724 A1 | 10/2016 | Vanaraj et al. | |
| 2016/0342344 A1 | 11/2016 | Kankani et al. | |
| 2016/0342345 A1 | 11/2016 | Kankani et al. | |
| 2016/0371394 A1 | 12/2016 | Shahidi et al. | |

(56) References Cited

U.S. PATENT DOCUMENTS

OTHER PUBLICATIONS

International Search Report and Written Opinion dated Nov. 9, 2015, received in International Patent Application No. PCT/UW2015/053551, which corresponds to U.S. Appl. No. 14/668,690, 12 pages (Thangaraj).
International Search Report and Written Opinion dated Nov. 11, 2015, received in International Patent Application No. PCT/UW2015/053582, which corresponds to U.S. Appl. No. 14/659,493, 12 pages (Prins).
International Search Report and Written Opinion dated Jul. 4, 2016, received in International Patent Application No. PCT/US2016/028477, which corresponds to U.S. Appl. No. 14/883,540, 11 pages (Hodgdon).
Atmel Data-sheet, "9-to-bit Selectable, ±0.5°C Accurate Digital Temperature Sensor with Nonvolatile Registers and Serial EEPROM" www.atmel.com/images/Atmel-8854-DTS-AT3OTSE752A-754A-758A-Datasheet.pdf, Atmel Data-sheet, Mar. 1, 2011,—Atmel-8854-DTS-AT3OTSE752A-754A-758A-Datasheet_102014, 57 pages.
Seagate Technology, "SCSI Commands Reference Manual, Rev. C", Product Manual dated Apr. 2010, pp. 211-214.
Tanenbaum, "Structured Computer Organization", 3rd edition 1990, section 1.4, p. 11, 3 pages.
International Search Report and Written Opinion dated Sep. 8, 2016, received in International Patent Application No. PCT/US2016/036716, which corresponds to U.S. Appl. No. 14/925,945, 13 pages (Ellis).

\* cited by examiner

ATOMIC NON-VOLATILE MEMORY DATA TRANSFER

RELATED APPLICATIONS

This application claims priority to U.S. Provisional Patent Application No. 62/022,591, filed Jul. 9, 2014, which is hereby incorporated by reference in its entirety.

TECHNICAL FIELD

The disclosed embodiments relate generally to memory systems, and in particular, to atomic data transfers within storage devices (e.g., dual in-line memory module (DIMM) devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

Since flash memory can only be programmed and erased a limited number of times, it is important to optimize memory management processes (e.g., garbage collection, wear leveling, caching, etc.) to enhance endurance of memory devices. It is also important to optimize data transfer processes to enhance performance and reduce power consumption of memory devices.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to perform atomic non-volatile memory data transfers. In one aspect, a storage device comprises: (1) a controller, (2) a plurality of memory die each comprising a plurality of non-volatile memory devices, (3) and a shared bus coupling the plurality of non-volatile memory die and the controller. The storage device is configured to: (1) read data from a first non-volatile memory device on a first memory die to the shared bus, (2) in conjunction with reading the data from the first non-volatile memory device to the shared bus, generate a data strobe at the first non-volatile memory device, (3) in response to receiving the data strobe at a second non-volatile memory device on a second memory die, transfer the data from the shared bus to the second non-volatile memory device, where the second memory die is distinct from the first memory die.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
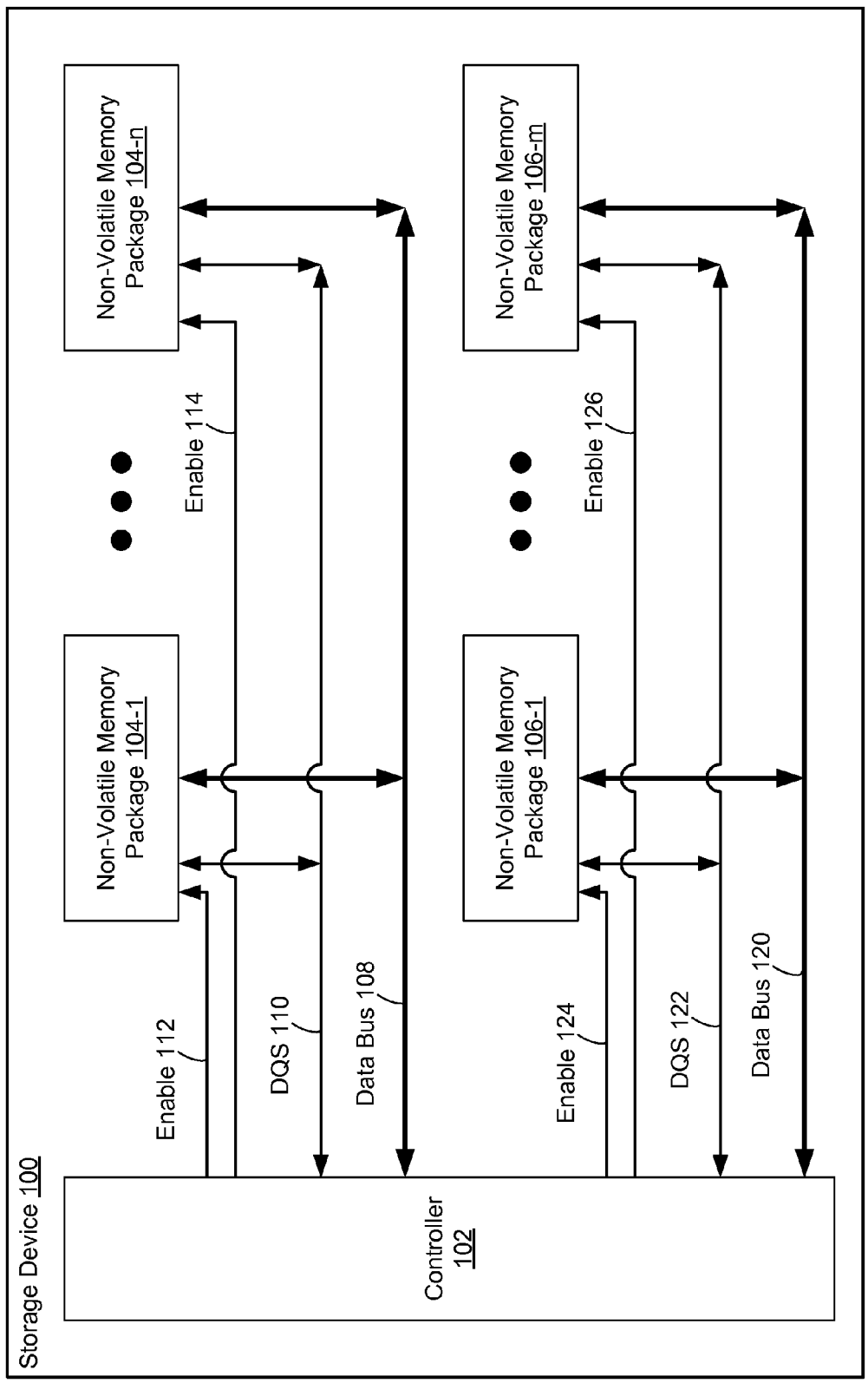
FIG. 1 is a block diagram illustrating an implementation of a storage device, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used for atomic non-volatile memory data transfers. Some implementations include systems, methods, and/or devices to perform an atomic non-volatile memory data transfer.

More specifically, some implementations include a method of transferring data within a storage device. In some implementations, the method includes: (1) reading data from a first non-volatile memory device to a shared bus, where the shared bus couples the first non-volatile memory device to a second non-volatile memory device and to the controller, and where the first non-volatile memory device is on a first die and the second non-volatile memory device is on a second die, distinct from the first die, (2) in conjunction with reading the data from the first non-volatile memory device to the shared bus, generating a data strobe at the first non-volatile memory device, and (3) in response to receiving the data strobe at the second non-volatile memory device, transferring the data from the shared bus to the second non-volatile memory device.

In some embodiments, the method further comprises, subsequent to transferring the data from the shared bus to the second non-volatile memory device, receiving a program command from the controller; and, in response to the program command, writing data from an internal buffer to non-volatile memory within the second non-volatile memory device.

In some embodiments, the method further comprises, prior to transferring the data from the shared bus to the second non-volatile memory device: (1) at the controller, in conjunction with reading the data from the first non-volatile memory device to the shared bus, determining whether the data on the shared bus meets predefined error correction criteria, where the predefined error correction criteria includes determining if a quantity of errors exceeds a predetermined threshold; (2) in accordance with a determination that the data on the shared bus meets the predefined error correction criteria, transferring correction data (e.g., corrected data to replace the data read from the first non-volatile memory device) via the shared bus to the second non-volatile memory device; and (3) subsequent to transferring the correction data, writing data (e.g., the corrected data) from an internal buffer to non-volatile memory within the second non-volatile memory device.

In some embodiments, the method further comprises, in conjunction with transferring the data from the shared bus to the second non-volatile memory device, generating a sampling data strobe by delaying the data strobe by a predetermined amount, and using the sampling data strobe at the second non-volatile memory device to sample the data on the shared bus.

In some embodiments, the shared bus couples the first non-volatile memory device to a third non-volatile memory device; and the method further comprises, in response to receiving the data strobe at the third non-volatile memory device, transferring the data from the shared bus to the third non-volatile memory device.

In some embodiments, the method further comprises, prior to reading data from the first non-volatile memory device to the shared bus, the controller enabling the first non-volatile memory device to perform a read operation and the controller enabling the second non-volatile memory device to perform an atomic data transfer operation.

In some embodiments, the method further comprises, prior to reading data from the first non-volatile memory device to the shared bus, receiving, at the first non-volatile memory device, a read strobe command generated by the controller, where generating the data strobe comprises the first non-volatile memory device generating the data strobe while reading data from the first non-volatile memory device to the shared bus.

In some embodiments, the shared bus couples a plurality of enhanced non-volatile memory packages, each enhanced non-volatile memory package in the plurality of enhanced non-volatile memory packages comprising a plurality of non-volatile memory devices and a bus driver module; where: (1) a first enhanced non-volatile memory package includes the first non-volatile memory device and a first bus driver module; and (2) a second enhanced non-volatile memory package includes the second non-volatile memory device and a second bus driver module; and (3) the second bus driver module delays the data strobe by a predetermined amount.

In some embodiments, reading data from the first non-volatile memory device to the shared bus comprises reading a page of data from the first non-volatile memory device to the shared bus.

In some embodiments, reading data from the first non-volatile memory device to the shared bus comprises reading data from a plurality of data pages of the first non-volatile memory device; and the method further comprises writing the data from the plurality of data pages of the first non-volatile memory device to a single data page of the second non-volatile memory device.

In some embodiments, transferring the data from the shared bus to the second non-volatile memory device comprises storing the data in volatile memory within the second non-volatile memory device.

In some embodiments, the first non-volatile memory device drives the shared bus.

In some embodiments, the method further comprising: (1) while reading data from the first non-volatile memory device to the shared bus, reading data from a fourth non-volatile memory device to a second shared bus, where the second shared bus couples the fourth non-volatile memory device to the controller and to a fifth non-volatile memory device; (2) generating a second data strobe at the fourth non-volatile memory device; and, (3) in response to receiving the second data strobe at the fifth non-volatile memory device, transferring the data from the second shared bus to the fifth non-volatile memory device.

In some embodiments, the storage device comprises one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

In another aspect, any of the methods described above are performed by a storage device comprising a controller, a plurality of memory die each comprising a plurality of non-volatile memory devices, and a shared bus coupling the plurality of non-volatile memory die and the controller. The storage device configured to: (1) read data from a first non-volatile memory device on a first memory die to the shared bus; (2) in conjunction with reading the data from the first non-volatile memory device to the shared bus, generate a data strobe at the first non-volatile memory device; and (3) in response to receiving the data strobe at a second non-volatile memory device on a second memory die, transfer the data from the shared bus to the second non-volatile memory device, wherein the second memory die is distinct from the first memory die.

In some embodiments, the storage device is configured to operate in accordance with any of the methods described above.

In yet another aspect, any of the methods described above are performed by a storage device including: (1) memory, (2) one or more processors coupled to the memory, and (3) one or more programs, stored in the memory and executed by the one or more processors, the one or more programs including instructions for performing any of the methods described above.

In yet another aspect, any of the methods described above are performed by a storage device operable to perform atomic data transfers. In some embodiments, the device includes: (1) a means for reading data from a first non-volatile memory device on a first memory die to the shared bus; (2) means for generating a data strobe at the first non-volatile memory device, in conjunction with reading the data from the first non-volatile memory device to the shared bus; and (3) means for transferring the data from the shared bus to the second non-volatile memory device, in response to receiving the data strobe at a second non-volatile memory device on a second memory die, where the second memory die is distinct from the first memory die.

In yet another aspect, any of the methods described above are performed by a storage controller including an interface for operatively coupling the storage controller with a storage medium and means for performing any of the methods described herein.

In yet another aspect, some embodiments include a non-transitory computer readable storage medium, storing one or more programs for execution by one or more processors of a storage device, the one or more programs including instructions for performing any of the methods described herein.

Numerous details are described herein in order to provide a thorough understanding of the example implementations illustrated in the accompanying drawings. However, some implementations may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram illustrating an implementation of storage device 100, in accordance with some embodiments. While some example features are illustrated, various other features have not been illustrated for the sake of brevity and so as not to obscure more pertinent aspects of the example implementations disclosed herein. To that end, as a non-limiting example, storage device 100 includes storage controller 102 (also sometimes called memory controller 102 and/or controller 102), non-volatile memory packages 104, and non-volatile memory packages 106 (sometimes herein called non-volatile memory modules or NVM modules). Storage device 100 also includes a plurality of enable signals: enable signal 112 for enabling operation of non-volatile memory package 104-1; enable signal 114 for enabling operation of non-volatile memory package 104-$n$; enable signal 124 for enabling operation of non-volatile memory package 106-1; and enable signal 126 for enabling operation of non-volatile memory package 106-$m$. Storage device 100 further includes data strobe (DQS) signals for reading data from memory and writing data to memory. For example, DQS 110 for reading/writing non-volatile memory packages 104 and DQS 122 for reading/writing non-volatile memory packages 106. Storage device 100 also includes data buses for transferring data between non-volatile memory packages and/or controller 102. For example, data bus 108 for transferring data between non-volatile memory packages 104 and controller 102, and data bus 120 for transferring data between non-volatile memory packages 106 and controller 102.

In some implementations, one or more of the non-volatile memory packages (e.g., non-volatile memory packages 104 and non-volatile memory packages 106) include a plurality of non-volatile memory die. In some implementations, one or more of the non-volatile memory packages include a plurality of non-volatile memory devices such as flash memory devices or a magnetic disk drive, sometimes called a hard drive. In some implementations, the plurality of non-volatile memory devices comprises NAND-type flash memory and/or NOR-type flash memory. In some implementations, the plurality of non-volatile memory devices includes one or more three-dimensional (3D) memory devices, as further defined herein. Further, in some implementations, storage controller 102 is a solid-state drive (SSD) controller. However, one or more other types of storage media may be included in accordance with aspects of a wide variety of embodiments. Furthermore, as discussed below with reference with FIG. 3, in some implementations one or more of the non-volatile memory packages 104/106 includes a control module for controlling some operations of non-volatile memories (e.g., NVM die) in those non-volatile memory packages 104/106. In some implementations, some or all of the non-volatile memory packages 104/106 are individual, single NVM die, such as individual NAND-type flash memory die.

In some implementations, storage device 100 includes a plurality of memory channel controllers where each memory channel controller controls memory operations corresponding to a particular data bus. For example, in accordance with some implementations, storage device 100 includes a first memory channel controller for controlling memory operations of non-volatile memory packages 104 along data bus 108. In this example, storage device 100 further includes a second memory channel controller for controlling memory operations of non-volatile memory packages 106 along data bus 120. In some implementations, the memory channel controllers are components of controller 102. In some implementations, controller 102 is a storage-level controller coupled to the memory channel controllers.

In some implementations, storage device 100 includes a host interface for communications with a host computer/device. In some implementations, storage device 100 is embedded in a host device, such as a mobile device, tablet, other computer or computer controlled device. Storage device 100 optionally includes any number (i.e., one or more) of memory devices including, without limitation, non-volatile semiconductor memory devices, such as flash memory. As a non-limiting example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Although FIG. 1 shows controller 102, non-volatile memory packages 104, and non-volatile memory packages 106, FIG. 1 is intended more as functional descriptions of the various features which may be present in a storage device, than as a structural schematic of the embodiments described herein. In practice, and as recognized by those of ordinary skill in the art, the components, packages, modules, and data structures shown separately could be combined and some components, packages, modules, and data structures could be separated.

Figure 2:
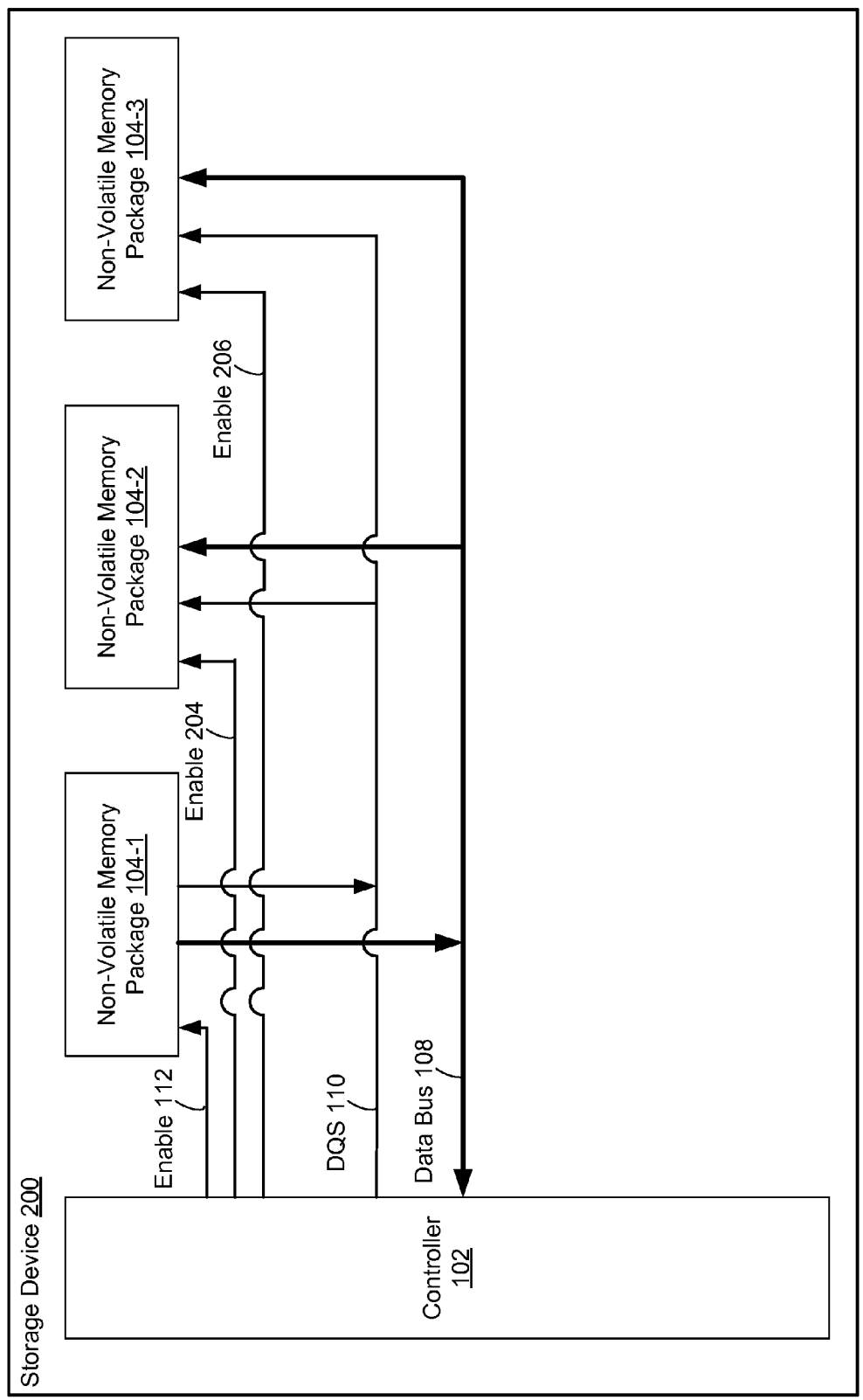
FIG. 2 is a block diagram illustrating another implementation of a storage device, in accordance with some embodiments.

FIG. 2 is a block diagram illustrating an implementation of storage device 200, in accordance with some embodiments. While some example features are illustrated, various other features have not been illustrated for the sake of brevity and so as not to obscure more pertinent aspects of the example implementations disclosed herein. To that end, as a non-limiting example, storage device 200 includes storage controller 102, non-volatile memory packages 104-1, 104-2, and 104-3. Storage device 100 also includes a plurality of enable signals: enable signal 112 for enabling operation of non-volatile memory package 104-1; enable signal 204 for enabling operation of non-volatile memory package 104-2; and enable signal 206 for enabling operation of non-volatile memory package 104-3. Storage device 200 further includes a data strobe bus, DQS 110, for conveying data strobe or other timing signals to control reading data from and writing data to non-volatile memory packages 104; and data bus 108 for transferring data between non-volatile memory packages 104 and/or controller 102. FIG. 2 further shows non-volatile memory package 104-1 driving data bus 108 and DQS 110.

Stated another way, in the example shown in FIG. 2, non-volatile memory package 104-1 outputs data onto data bus 108 and outputs a data strobe (sometimes called a data strobe signal or DQS signal) onto DQS 110.

Although FIG. 2 shows controller 102 and non-volatile memory packages 104, FIG. 2 is intended more as functional descriptions of the various features which may be present in a storage device, than as a structural schematic of the embodiments described herein. In practice, and as recognized by those of ordinary skill in the art, the programs, modules, and data structures shown separately could be combined and some programs, modules, and data structures could be separated.

Figure 3:
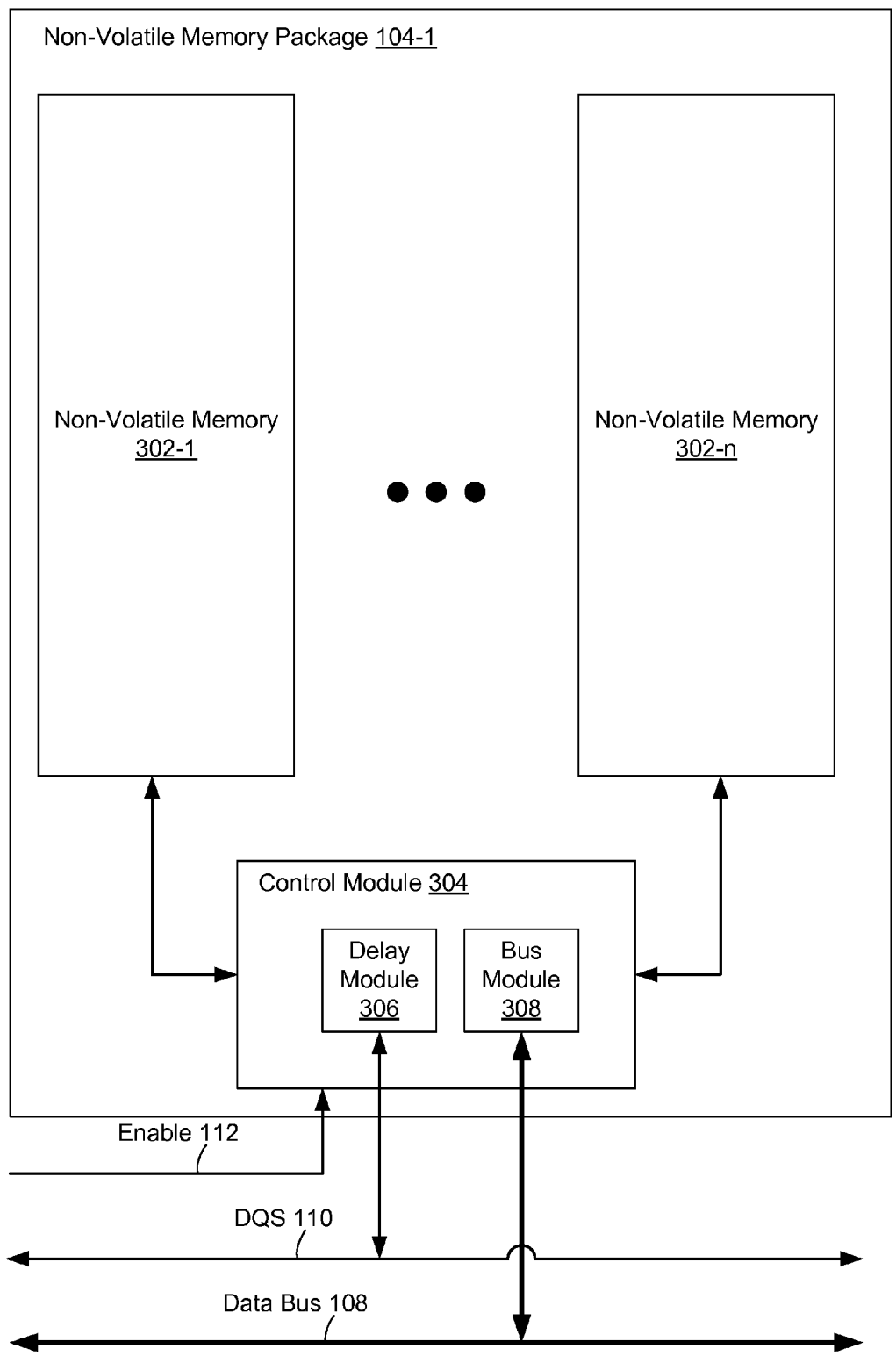
FIG. 3 is a block diagram illustrating an implementation of a non-volatile memory package, in accordance with some embodiments.

FIG. 3 is a block diagram illustrating an implementation of non-volatile memory package 104-1, sometimes herein called a non-volatile memory module or NVM module, in accordance with some embodiments. Non-volatile memory package 104-1 typically includes a plurality of non-volatile memories 302 for storing data and control module 304 for controlling some operations of non-volatile memories 302. Control module 304 typically includes timing module 306 and bus module 308. Timing module 306 adjusts the timing of data strobes received from DQS 110. In some implementations, timing module 306 includes a skew register. In some implementations, timing module 306 includes a programmable delay line. Bus module 508 controls receiving data from and transmitting data to data bus 108. Bus module 308 typically includes volatile memory (e.g., a plurality of registers) for storing data as well as one or more components for driving data bus 108 (e.g., for driving data bus 108 during an atomic data transfer operation). Control module 304 optionally includes one or more processing units (CPU(s), also sometimes called one or more processors) configured to execute instructions in one or more programs.

Non-volatile memory package 104-1 receives enable signal 112, data strobes from DQS 110, and data from data bus 108. In some implementations, non-volatile memory package 104-1 receives one or more additional control signals. For example, in some implementations, non-volatile memory package 104-1 receives a read signal and address information from a controller (e.g., controller 102, FIG. 1) for reading data from non-volatile memory to data bus 108.

In some implementations, the non-volatile memory (e.g., non-volatile memory 302-1) is divided into a number of addressable and individually selectable blocks. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. For example, one block comprises any number of pages, for example, 64 pages, 128 pages, 256 pages or another suitable number of pages. Blocks are typically grouped into a plurality of planes and/or zones. Each block plane or zone can be independently managed to some extent, which increases the degree of parallelism for parallel operations and simplifies management of the non-volatile memory.

In some implementations, the non-volatile memory (e.g., non-volatile memory 302-1) includes metadata corresponding to respective portions of the non-volatile memory (e.g., blocks, portions, pages, sectors, zones, and/or planes). In some implementations, the metadata includes information regarding the health and/or age of the corresponding portion of the non-volatile memory (e.g., an estimate of how many erase cycles may be performed before the portion fails). In some implementations, the non-volatile memory includes a mapping of known-bad portions of the non-volatile memory (e.g., known-bad portions). In some implementations, the non-volatile memory includes a mapping of good portions of the non-volatile memory (e.g., a mapping that excludes known-bad portions). In some implementations, the metadata and/or mapping is stored in control module 304 (e.g., instead of storing in the non-volatile memory or in addition to storing in the non-volatile memory). In some implementations, the metadata and/or mapping is stored in a controller (e.g., controller 102, FIG. 1).

Figure 4:
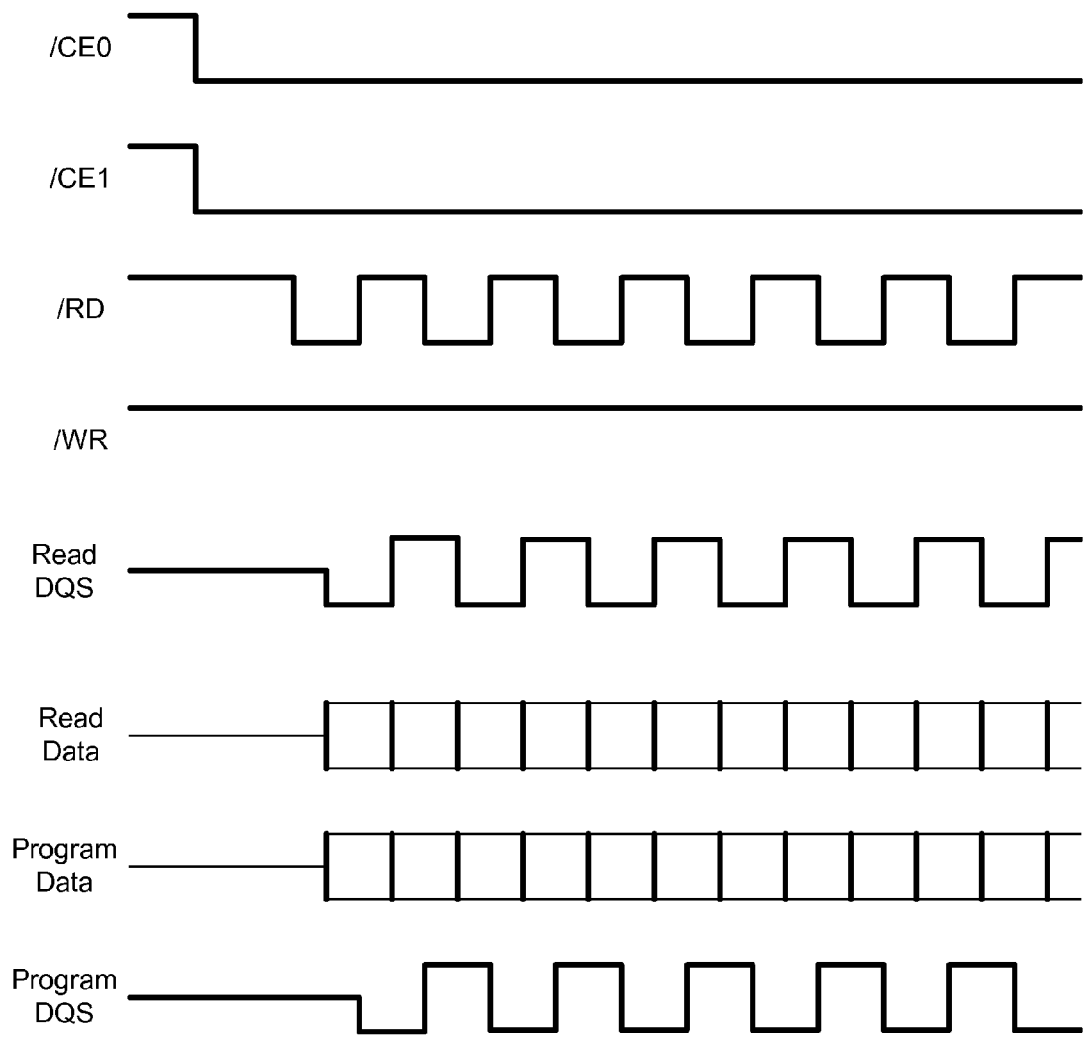
FIG. 4 is a diagram of signal timing corresponding to an atomic data transfer operation, in accordance with some embodiments.

FIG. 4 is a diagram of signal timing corresponding to an atomic data transfer operation, in accordance with some embodiments. Signals /CE0 and /CE1 are active-low enable signals for enabling a first non-volatile memory package and a second non-volatile memory package respectively (e.g., non-volatile memory package 104-1 and non-volatile memory package 104-2). For example, during an atomic data transfer operation, /CE0 enables a first non-volatile memory package to read data to a shared bus and /CE1 enables a second non-volatile memory package to write the data from the shared bus. /CE0 and /CE1 are typically generated by a controller (e.g., controller 102, FIG. 1). /RD is an active-low read signal generated by the controller for reading data from a first non-volatile memory package to a shared bus. /WR is an active-low write signal generated by the controller for writing data from the shared bus to the second non-volatile memory package. In some implementations, /WR is not used during an atomic data transfer operation and therefore may be in any state. Read DQS is a data strobe that corresponds to reading data from a first non-volatile memory package to the shared bus. In some implementations, Read DQS is generated by the first non-volatile memory package in conjunction with reading data from memory to the shared bus. Read Data and Program Data illustrate when data is valid for reading and writing (sometimes called programming) respectively. Program DQS is a data strobe that corresponds to writing (sometimes called programming) data from the shared bus to a second non-volatile memory package. In some implementations, programming data comprises storing the data in volatile memory within the non-volatile memory package (e.g., in registers or a buffer within control module 304) and then transferring the data from volatile memory to non-volatile memory. In some implementations, Program DQS is generated by delaying Read DQS. In some implementations, Program DQS is delayed at the second non-volatile memory package (e.g., by delay module 306 of the second non-volatile memory package).

Figure 5:
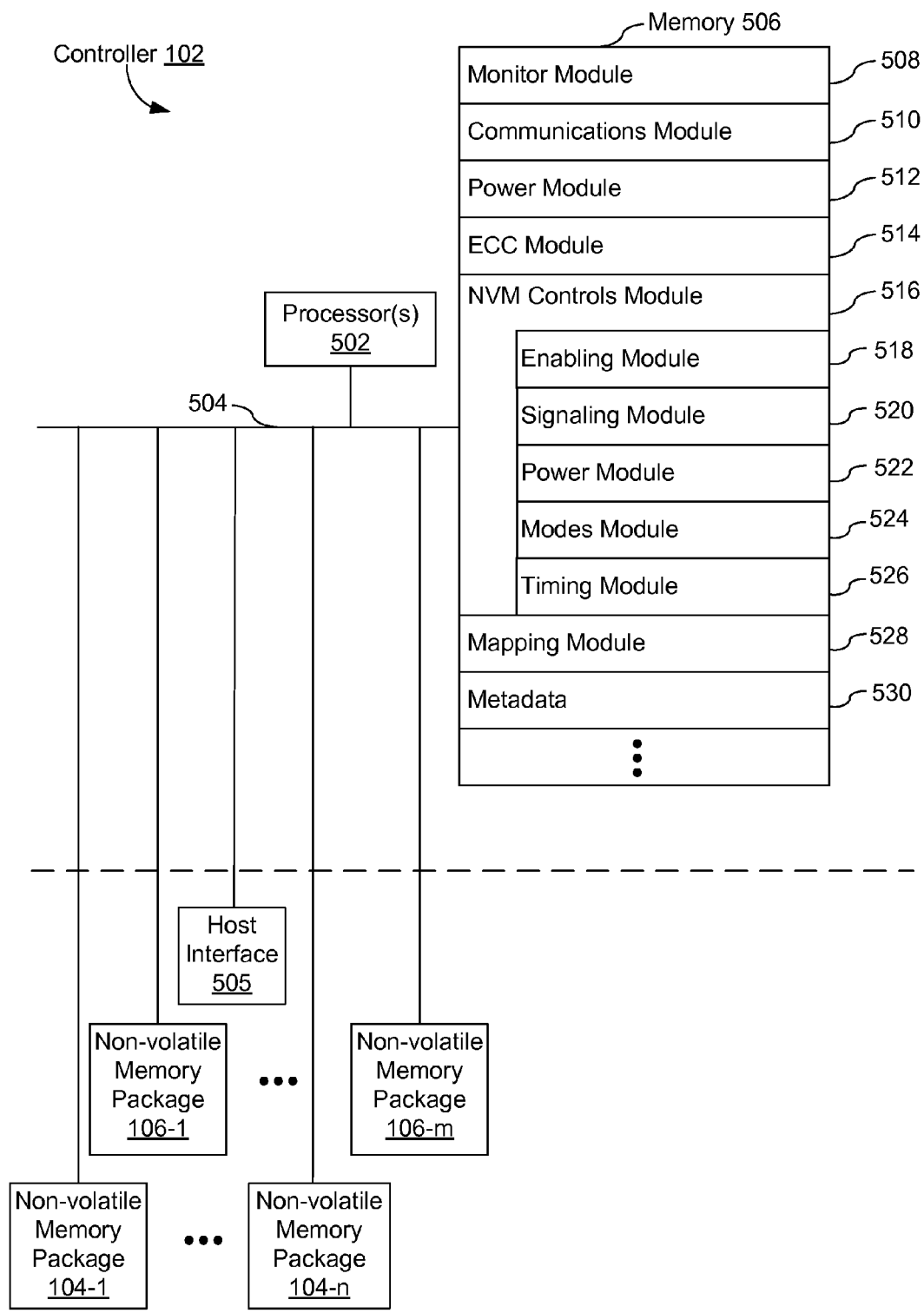
FIG. 5 is a block diagram illustrating an implementation of a memory controller, in accordance with some embodiments.
Figure 6A:
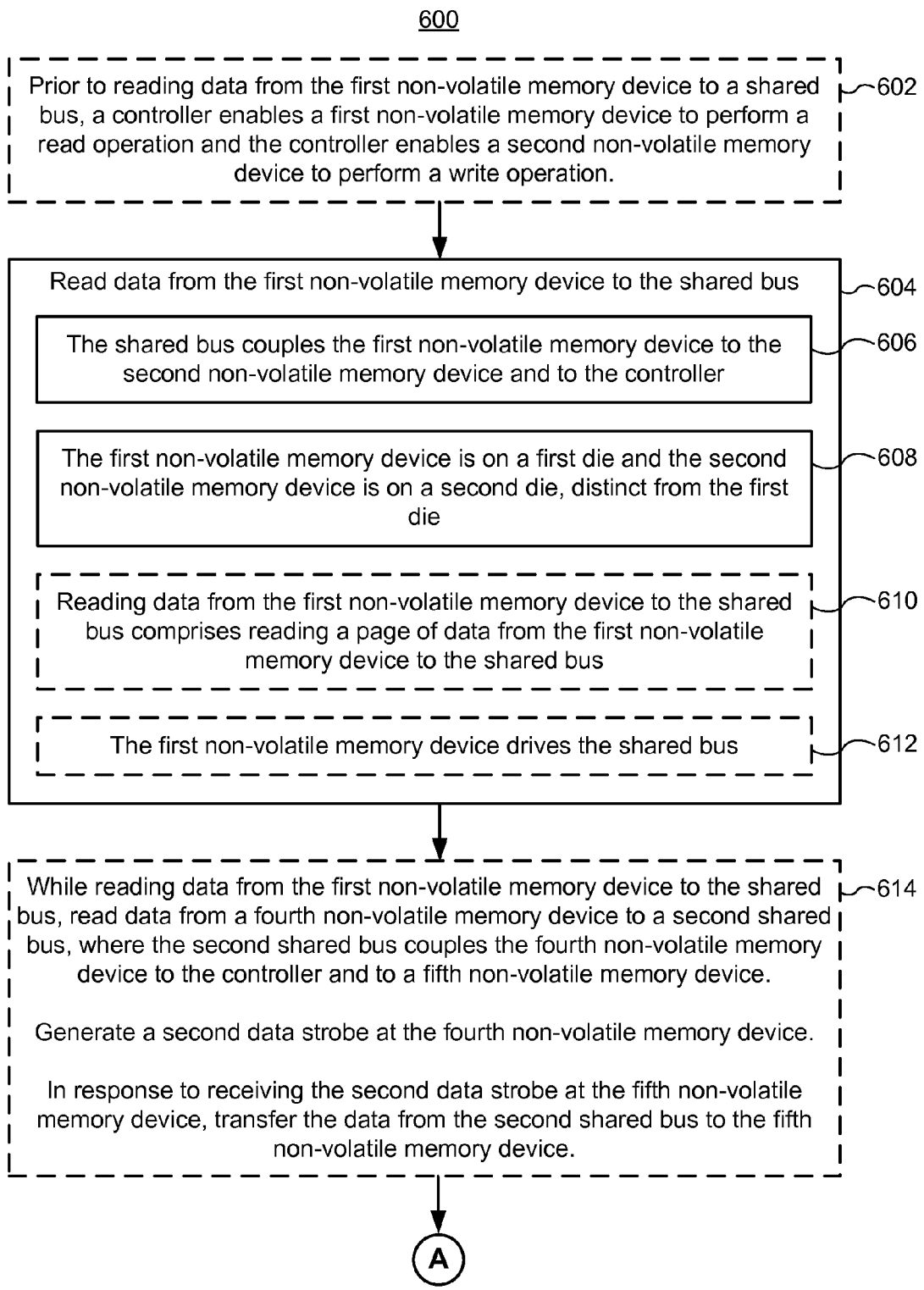
FIGS. 6A-6D illustrate a flowchart representation of a method of performing an atomic non-volatile memory data transfer, in accordance with some embodiments.
Figure 6B:
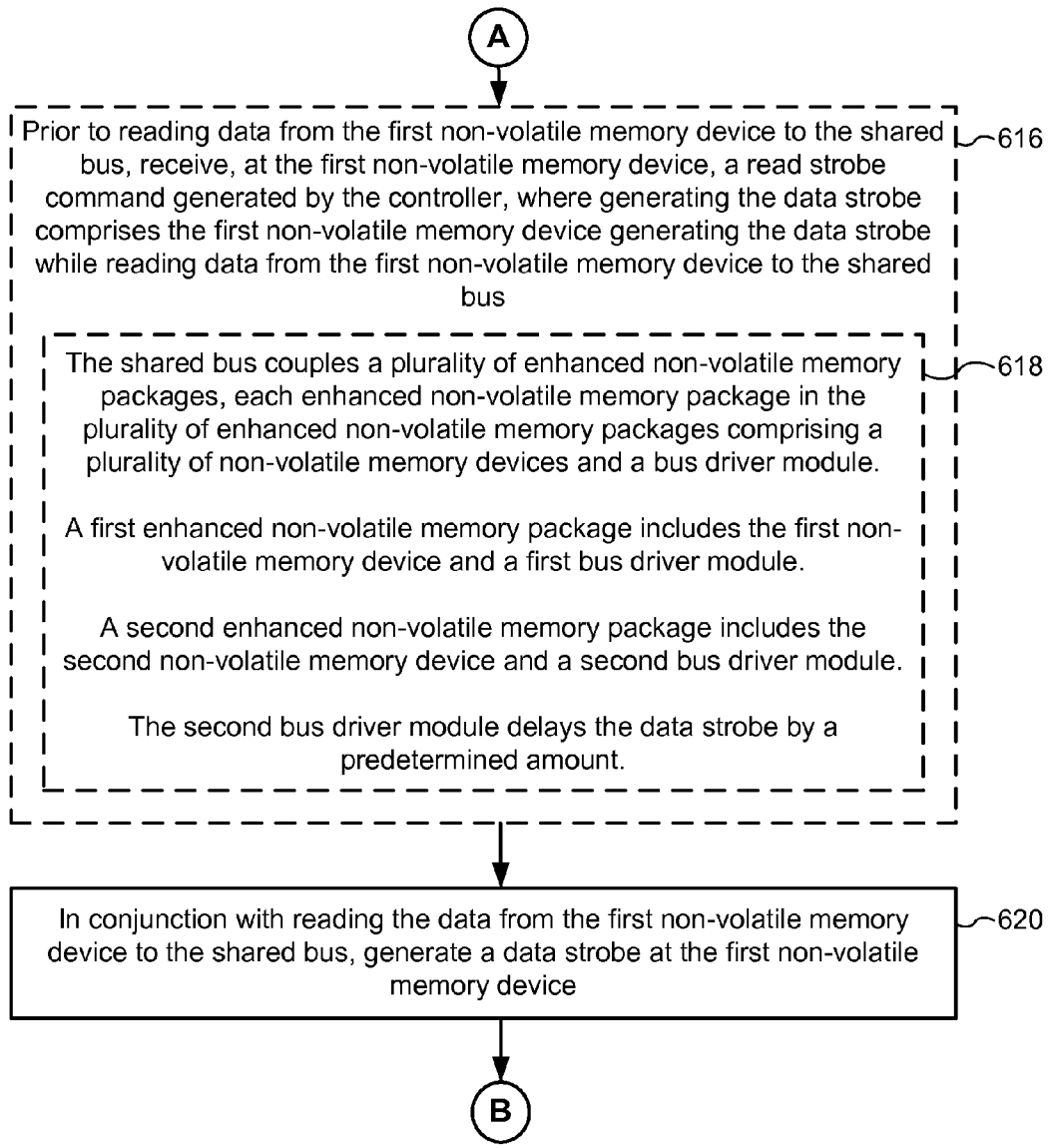
Figure 6C:
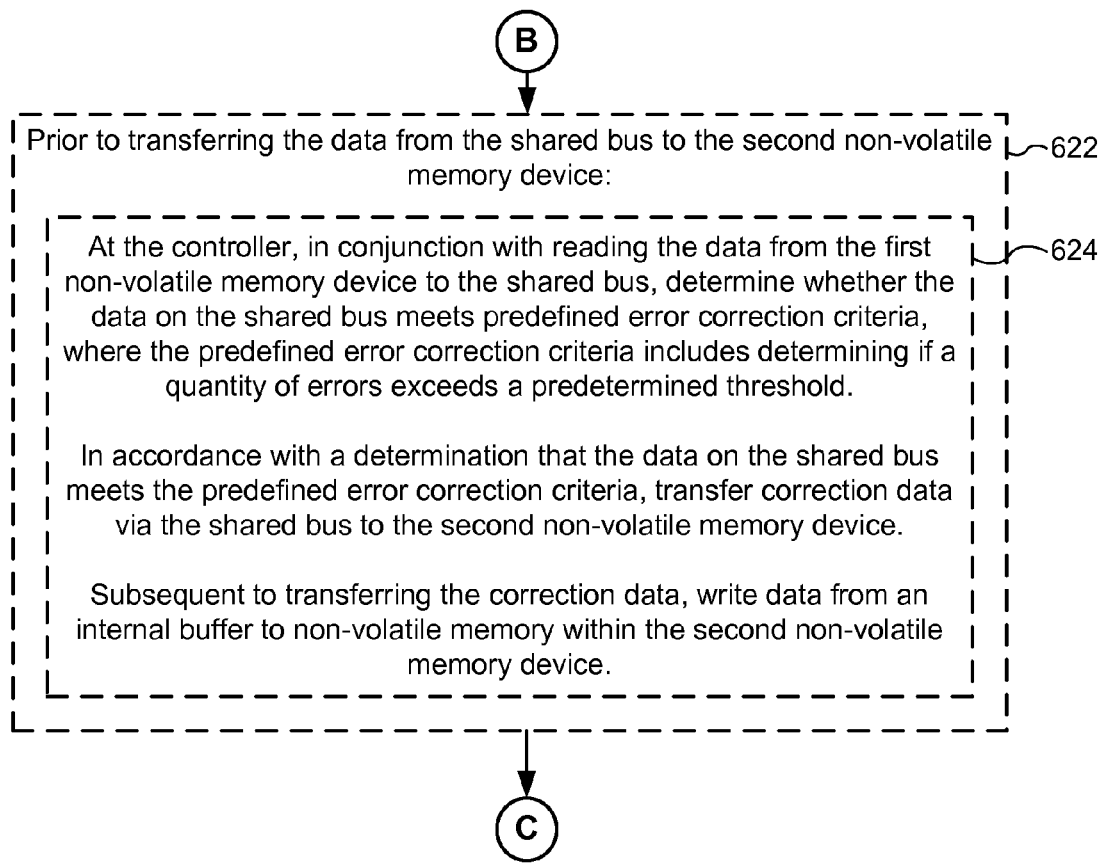
Figure 6D:
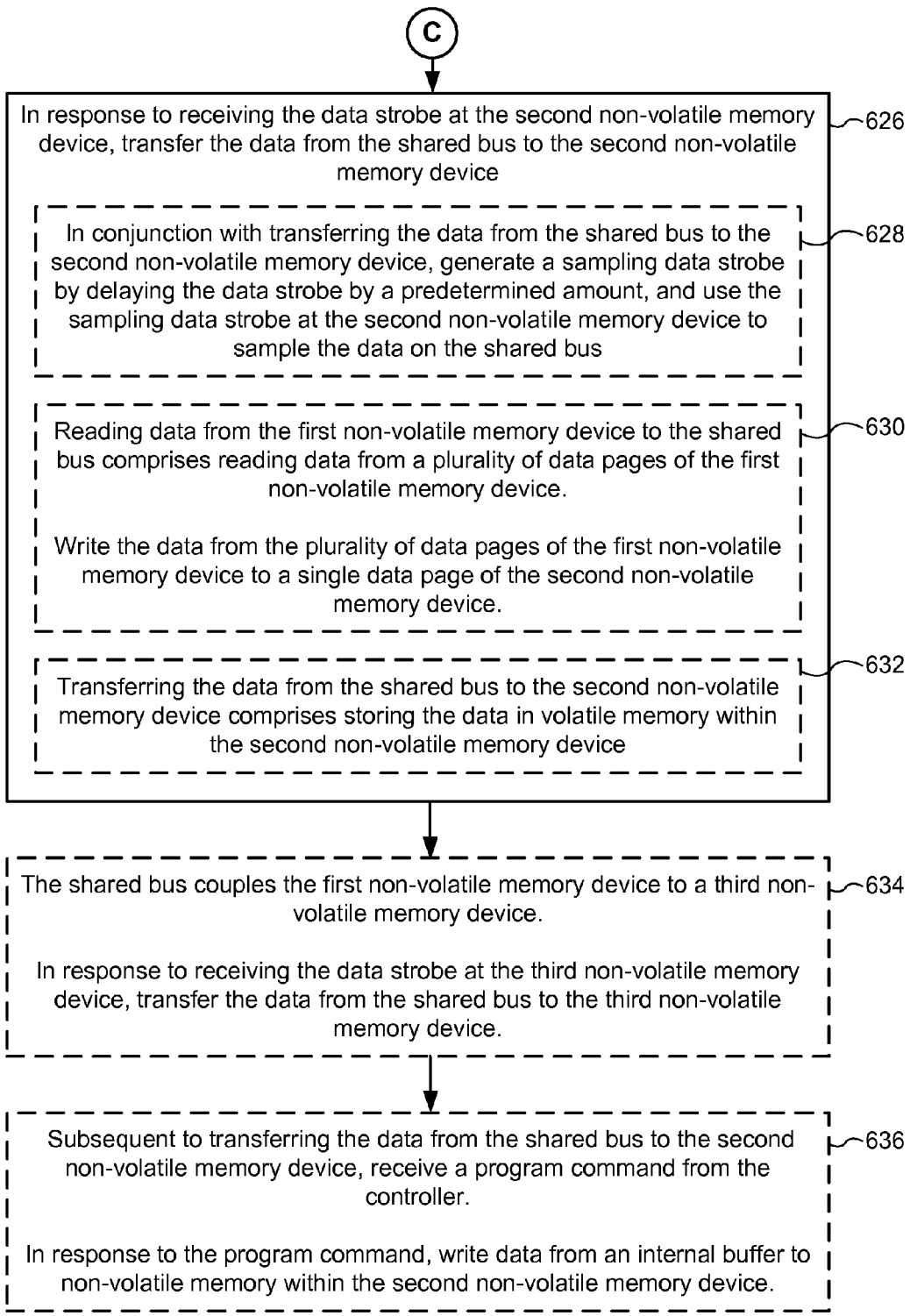

FIG. 5 is a block diagram illustrating an implementation of memory controller 102, in accordance with some embodiments. Memory controller 102 typically includes: one or more processing units (CPUs) 502 for executing modules, programs and/or instructions stored in memory 506 and thereby performing processing operations; memory 506; and one or more communication buses 504 for interconnecting these components. In some implementations, one or more CPUs 502 are shared by one or more components within, and in some cases, beyond the function of controller 102.

One or more communication buses 504, optionally, include circuitry (sometimes called a chipset) that interconnects and controls communications between system components. Memory controller 102 is operatively coupled with non-volatile memory packages 104 and with non-volatile memory packages 106 by one or more communication buses 504. In some implementations, memory controller 102 is operatively coupled with host interface 505. Memory controller 102 may include various additional features that have not been illustrated for the sake of brevity and so as not to obscure more pertinent features of the example embodiments disclosed herein, and that a different arrangement of features may be possible.

Memory 506 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. In some implementations, memory 506 includes metadata 530 (e.g., metadata denoting a known-bad portion) corresponding to portions of non-volatile memory (e.g., portions of non-volatile memory package 104-1). Memory 506, optionally, includes one or more storage devices remotely located from one or more CPUs 502. Memory 506, or alternatively the non-volatile memory device(s) within memory 506, comprises a non-transitory computer readable storage medium. In some embodiments, memory 506, or the non-transitory computer readable storage medium of memory 506, stores the following programs, modules, and data structures, or a subset or superset thereof: monitor module 508, communications module 510, power module 512, ECC module 514, non-volatile memory controls module 516, mapping module 528, and metadata 530.

Monitor module 508 is provided to monitor signals provided to controller 102, for example to monitor and determine whether a power supply voltage provided to the storage device is lower than an under-voltage threshold.

Communications module 510 is provided to communicate with other controllers (e.g., memory channel controllers) within the storage device and/or with a host system coupled to the storage device.

Power module 512 is provided to control power supplied to coupled components (e.g., non-volatile memory packages 104) and/or to monitor power usage by the coupled components. In some implementations, power module 512 is used to perform a power fail operation in response to certain criterion or signals.

ECC module 514 is provided to limit the number of uncorrectable errors inadvertently introduced into data. In some implementations, error control module 514 is executed in software by one or more CPUs 502 of controller 102, and, in other implementations, error control module 514 is implemented in whole or in part using special purpose circuitry to perform encoding and decoding functions. To that end, error control module 514 includes an encoder and a decoder. The encoder encodes data by applying an error control code to produce a codeword, which is subsequently stored in memory (e.g., in non-volatile memory).

When the encoded data (e.g., one or more codewords) is read from non-volatile memory, ECC module 514 (e.g., a decoder within ECC module 514) applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

For example, during a write operation, controller 102 receives data from host device or other source. The data is made available to ECC module 514 (e.g., to an encoder within ECC module 514), which encodes the data to produce one or more codewords. The one or more codewords are then written to memory in a manner dependent on the type of memory being utilized.

As another example, during a read operation or an atomic data transfer operation (from a first non-volatile memory device to a second non-volatile memory device), controller 102 sends one or more read signals (e.g., /RD signal in FIG. 4) to non-volatile memory to obtain raw read data in accordance with memory locations (addresses) for the operation being performed. The raw read data (e.g., comprising one or more codewords) is provided to ECC module 514 (e.g., to a decoder within ECC module 514). If the decoding is successful, the decoded data is, optionally, made available to a host system and/or to non-volatile memory.

In some embodiments, in the case of an atomic data transfer, if the decoding is successful and the number of errors found is below a predetermined threshold, the decoded data is simply discarded and the atomic data transfer operation completes without requiring performance of any remedial action. However, in the case of an atomic data transfer, if the decoding is successful but the number of errors found is equal to or greater than the predetermined threshold, the uncorrected transferred data is marked invalid after being written to the second non-volatile memory device, or alternatively, the uncorrected transferred data is not written to the second non-volatile memory device (e.g., it is held in a volatile memory buffer until the decoding is completed), and the corrected, decoded data is written to the second non-volatile memory device.

In some instances, if the decoding is not successful, controller 102 may resort to a number of remedial actions or provide an indication of an irresolvable error condition.

Non-volatile memory controls module 516 is provided to control operation of the non-volatile memory (e.g., non-volatile memory packages 104 and non-volatile memory packages 106). Non-volatile memory controls module 516 optionally includes enabling module 518, signaling module 520, power module 522, modes module 524, and timing module 526, or a subset or superset thereof. Enabling module 518 controls enablement of the non-volatile memory for various operations (e.g., reading and/or writing). In some implementations, enabling module 518 also determines relevant memory locations (addresses) for various operations. Signaling module 520 provides signals to the non-volatile memory (e.g., read and write signals) in accordance with various operations. In some implementations, signaling module 520 includes a data read sub-module for performing a read operation to read data from non-volatile memory according to a read command from a host system. In some implementations, signaling module 520 includes a data write sub-module for performing a write operation to write data to non-volatile memory according to a write command from a host system. In some implementations, signaling module 520 includes a data erase sub-module for performing an erase operation to erase data from non-volatile memory according to an erase command from a host system. Power module 522 monitors and/or controls power supplied to the non-volatile memory packages (e.g., non-volatile memory package 104-1). Modes module 524 controls the modes of operation of the non-volatile memory. In some implementations, modes module 524 controls the modes of operation of the non-volatile memory packages. In some implementations, the non-volatile memory and/or the corresponding non-volatile memory package is in a first mode during atomic data transfers and in a second mode during read/write operations to the controller. In some implementations, the non-volatile memory and/or the corresponding non-volatile memory package is in a first mode when reading data and in a second mode when writing data. Timing module 526 controls the timing of various operations performed by the non-volatile memory and/or the non-volatile memory packages. In some implementations, timing module 526 controls the timing of a clock signal, such as a data strobe signal, generated by the controller 102. In some implementations, timing module 526 and signaling module 520 are combined to control the timing of various signals sent to the non-volatile memory and/or non-volatile memory packages.

Mapping module 528 is provided to map logical addresses (e.g., in a logical address space of a host system) to physical addresses for respective portions of non-volatile memory (e.g., portions of non-volatile memory package 104-1), and optionally, to map physical addresses for respective portions of non-volatile memory to logical addresses. In some implementations, mapping module 528 includes information corresponding to known-bad portions of non-volatile memory. In some implementations, mapping module 528 also determines relevant memory locations (addresses) for various operations. In some implementations, mapping module 528 maintains both a forward map, sometimes called a logical to physical address translation table, for mapping logical addresses in a logical address space (e.g., a logical address space of a host computer or host system) to physical addresses in storage device 100, and one or more reverse maps for mapping physical addresses in storage device 100 to logical addresses in the logical address space.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 506 stores a subset of the modules and data structures identified above. Furthermore, memory 506 may store additional modules and data structures not described above. In some embodiments, the programs, modules, and data structures stored in memory 506, or the non-transitory computer readable storage medium of memory 506, provide instructions for implementing any of the methods described below with reference to FIGS. 6A-6D.

Although FIG. 5 shows controller 102, FIG. 5 is intended more as functional descriptions of the various features which may be present in a controller, than as a structural schematic of the embodiments described herein. In practice, and as recognized by those of ordinary skill in the art, the programs, modules, and data structures shown separately could be combined and some programs, modules, and data structures could be separated. For example, in some implementations, in which controller 102 includes a main storage controller and multiple memory channel controllers, NVM controls module 516 may be implemented either completely or in large part, in each of the memory channel controllers, while other functions of controller 102 such as ECC module 514 and mapping module 528, are implemented by the main storage controller.

FIGS. 6A-6D illustrate a flowchart representation of method 600 of performing an atomic non-volatile memory data transfer, in accordance with some embodiments. In some implementations, method 600 is performed by a storage device. In some implementations, the storage device includes a solid state device. In some implementations, the storage device includes a dual in-line memory module (DIMM) device. In some implementations, the storage device is compatible with a DIMM memory slot. For example, in some implementations, the storage device is compatible with a 240-pin DIMM memory slot using a DDR3 interface specification. In some implementations, the storage device includes a storage controller (e.g., controller 102, FIG. 1) and a plurality of non-volatile memory packages (e.g., non-volatile memory packages 104). In some implementations, the storage device coordinates and manages multiple sub-system components to perform an atomic non-volatile memory data transfer. At least in some implementations, the performance of method 600 is controlled by a storage controller (e.g., controller 102, FIG. 1). In some implementations, method 600 is governed by instructions that are stored in a non-transitory computer readable storage medium and that are executed by one or more processors of a device, such as the one or more processors 502 of controller 102, as shown in FIG. 5. In some implementations, an atomic data transfer operation is used during a garbage collection process to reduce the time to complete the process as well as to reduce power consumed during the process.

In some embodiments, prior to reading data from a first non-volatile memory device to a shared bus, a controller enables (602) the first non-volatile memory device to perform a read operation and the controller enables the second non-volatile memory device to perform a write operation. Together, the read operation and write operation comprise an atomic data transfer operation. For example, FIG. 4 shows /CE0 and /CE1 signals for enabling a first non-volatile memory device and a second non-volatile memory device respectively. As another example, controller 102 in FIG. 1 enables non-volatile memory package 104-1 via enable signal 112 and enables non-volatile memory package 104-n via enable signal 114. In some implementations, enable signal 112 and enable signal 114 are the same signal.

The storage device reads (604) data from the first non-volatile memory device to the shared bus. In some implementations, reading data from the first non-volatile memory device to the shared bus includes reading data from non-volatile memory, storing it in volatile memory (e.g., a plurality of registers, such as registers configured as a shift register), and driving the shared bus with the data stored in the volatile memory. For example, control module 304 in FIG. 3 stores data read from non-volatile memory 302-1 in a plurality of registers and drives data bus 108 with the output of the registers (e.g., drives data bus 108 using bus module 308).

The shared bus couples (606) the first non-volatile memory device to a second non-volatile memory device and to the controller. For example, FIG. 1 shows data bus 108 coupling controller 102 with non-volatile memory packages 104 (e.g., non-volatile memory package 104-1 through non-volatile memory package 104-n).

The first non-volatile memory device is (608) on a first die and the second non-volatile memory device is on a second die, distinct from the first die. In some implementations, the first non-volatile memory device is within a first non-volatile memory package and the second non-volatile memory device is within a second non-volatile memory package, distinct from the first non-volatile memory package. For example, in accordance with some implementations, the first non-volatile memory device is within non-volatile memory package 104-1 (FIG. 2) and the second non-volatile memory device is within non-volatile memory package 104-3 (FIG. 2).

In some embodiments, reading data from the first non-volatile memory device to the shared bus includes (610) reading a page of data from the first non-volatile memory device to the shared bus. As discussed above with reference to FIG. 3, in some implementations a page is an instance of the smallest individually readable portion in a block. For example, in accordance with some implementations, a page of data is read from non-volatile memory 302-1 (FIG. 3) and stored in volatile memory within control module 304. In this example, data bus 108 is then driven by control module 304 using the data stored in the volatile memory. In some implementations, only a portion of the data is read to the shared bus (e.g., the data portion excludes known-bad sectors). In some implementations, a plurality of data pages is read from the first non-volatile memory device to the shared bus during a single atomic data transfer operation.

In some embodiments, the first non-volatile memory device drives (612) the shared bus. In some implementations, the reading, generating, and writing comprise performance of an atomic data transfer and, during the atomic data transfer, the first non-volatile memory device drives the shared bus. In some implementations, the transferring is asynchronous. In some implementations, the transferring is synchronous. For example, in accordance with some implementations, a data is read from non-volatile memory 302-n (FIG. 3) and stored in volatile memory within control module 304. In this example, data bus 108 is then driven by control module 304 using the data stored in the volatile memory.

In some embodiments, while reading data from the first non-volatile memory device to the shared bus, (e.g., while performing the first atomic data transfer) the storage device reads (614) data from a fourth non-volatile memory device to a second shared bus, where the second shared bus couples the fourth non-volatile memory device to the controller and to a fifth non-volatile memory device. The storage device generates a second data strobe at the fourth non-volatile memory device. In response to receiving the second data strobe at the fifth non-volatile memory device, the storage device transfers the data from the second shared bus to the fifth non-volatile memory device. In some implementations, the storage device simultaneously reads data from the first non-volatile memory device and the fourth non-volatile memory device. For example, in accordance with some implementations, a first atomic data transfer operation is performed between non-volatile memory package 104-1 (FIG. 1) and non-volatile memory package 104-n simultaneously with a second atomic data transfer operation being performed between non-volatile memory package 106-1 and non-volatile memory package 106-m. In this example, controller 102 controls some aspects of both atomic data transfer operations. In some implementations, a first memory channel controller controls the first atomic data transfer operation and a second memory channel controller controls the second atomic data transfer operation.

In some embodiments, prior to reading data from the first non-volatile memory device to the shared bus, the storage device receives (616), at the first non-volatile memory device, a read strobe command generated by the controller, where generating the data strobe includes the first non-volatile memory device generating the data strobe while reading data from the first non-volatile memory device to the shared bus. For example, in accordance with some implementations, Read DQS (FIG. 4) is generated by a first non-volatile memory device in conjunction with data being read from the first non-volatile memory device. The read strobe command, ReadDQS, commands the first non-volatile memory device to generate a data storage while reading data from the first non-volatile memory device to the shared bus.

In some implementations, the controller generates a read signal (e.g., /RD, FIG. 4) and the first non-volatile memory device reads data and generates a data strobe (e.g., Read DQS, FIG. 4) based on the read signal received from the controller. In some implementations, the data strobe is used to indicate the times when the data read from the non-volatile memory is valid. In some implementations, the data strobe is used to indicate when the data transferred to the shared bus is valid. From another viewpoint, in some implementations, edges of the data strobe correspond to transitions between distinct data values in the data transferred to the shared bus.

In some embodiments, the shared bus couples (618) a plurality of enhanced non-volatile memory packages, each enhanced non-volatile memory package in the plurality of enhanced non-volatile memory packages comprising a plurality of non-volatile memory devices and a bus driver module. A first enhanced non-volatile memory package, of the plurality of enhanced non-volatile memory packages, includes the first non-volatile memory device and a first bus driver module; a second enhanced non-volatile memory package, of the plurality of enhanced non-volatile memory packages, includes the second non-volatile memory device and a second bus driver module; and the first or second bus driver module skews (e.g., delays) the data strobe by a predetermined amount. In some implementations, the first and/or second bus driver module includes a skew register and a programmable delay line. In some implementations, the predetermined amount of delay is programmable. For example, FIG. 3 shows non-volatile memory package 104-1 (e.g., an enhanced non-volatile memory package), which includes non-volatile memories 302 and control module 304. In this example, control module 304 includes delay module 306 for skewing DQS 110 and bus module 308 for reading data from data bus 108 and/or driving data bus 108 with data stored in memory within non-volatile memory package 104-1. In some implementations, the predetermined amount of delay is based on the number and location of the non-volatile memory devices writing the data from the shared bus. For example, a first atomic data transfer operation includes writing data from a non-volatile memory device within non-volatile memory package 104-1 (FIG. 2) to a second non-volatile memory device within non-volatile memory package 104-2 and the predetermined amount of delay is X. In this example, a second atomic data transfer operation includes writing data from the first non-volatile memory device within non-volatile memory package 104-1 to both a second non-volatile memory device within nonvolatile memory package 104-2 and a third non-volatile memory device within non-volatile memory package 104-3 and the predetermined amount of delay is 1.2X.

In conjunction with reading the data from the first non-volatile memory device to the shared bus, the storage device generates (620) a data strobe at the first non-volatile memory device. In some implementations, the storage device generates the data strobe at the first non-volatile memory device while reading the data from the first non-volatile memory device. In some implementations, as data is read from non-volatile memory, a data strobe is generated such that the data strobe indicates the time when the read data is valid. In some implementations, reading data from a first non-volatile memory device to a shared bus means reading the data from the first non-volatile memory device and transmitting the data via the shared bus. In some implementations, the data strobe generated by the first non-volatile memory device is transmitted to the second non-volatile memory device via a DQS line. In some implementations, the data strobe generated by the first non-volatile memory device is transmitted to the second non-volatile memory device via the shared bus.

In some embodiments, prior to transferring (622) the data from the shared bus to the second non-volatile memory device, at the controller, in conjunction with reading the data from the first non-volatile memory device to the shared bus, the storage device determines (624) whether the data on the shared bus meets predefined error correction criteria, where the predefined error correction criteria includes determining if a quantity of errors exceeds a predetermined threshold. In accordance with a determination that the data on the shared bus meets the predefined error correction criteria, the storage device transfers correction data (e.g., corrected data to replace the data read from the first non-volatile memory device, or correction values that are used to correct the data read from the first non-volatile memory device and thereby generate corrected data) via the shared bus to the second non-volatile memory device. Subsequent to transferring the correction data, the storage device writes data (e.g., the corrected data) from an internal buffer to non-volatile memory within the second non-volatile memory device (e.g., in response to a program command). For example, in accordance with some implementations, controller 102 stores the data read from the first non-volatile memory device in memory (e.g., memory 506, FIG. 5) associated with controller 102 and performs a decoding process (e.g., using ECC module 514) on the data to identify and/or correct errors in the data. In some implementations, the correction data is the data from the shared bus that has been corrected. In some implementations, the correction data is generated at the controller based the data from the first non-volatile memory device (e.g., generated by a decoding process performed by ECC module 514). In some implementations, the correction data is data read from memory. In some implementations, the correction data is obtained by performing a second read operation at the first non-volatile memory device. In some implementations, the correction data is obtained by reading data stored in a second non-volatile memory device (e.g., mirrored data). In some implementations, the correction data is stored in place of the data on the shared bus (e.g., overwrites the data on the shared bus). In some implementations, the correction data is used by a non-volatile memory package (e.g., used by control module 304 in non-volatile memory package 104-1) to correct errors in the data on the shared bus.

In response to receiving the data strobe at the second non-volatile memory device, the storage device transfers (626) the data from the shared bus to the second non-volatile memory device. In some implementations, the second non-volatile memory device is within a second non-volatile memory package and the storage device transfers the data from the shared bus to volatile memory within a second non-volatile memory package (e.g., volatile memory within control module 304, FIG. 3) then writes the data from the volatile memory to the second non-volatile memory device (e.g., non-volatile memory 302-1). In some implementations, the second non-volatile memory device is within a second non-volatile memory package and the second non-volatile memory package delays the data strobe and then uses the delayed data strobe to transfer data from the shared bus to the second non-volatile memory device.

In some embodiments, in conjunction with transferring the data from the shared bus to the second non-volatile memory device, the storage device generates (628) a sampling data strobe by delaying the data strobe by a predetermined amount, and uses the sampling data strobe at the second non-volatile memory device to sample the data on the shared bus. For example, in accordance with some implementations, delay module 306 in FIG. 3 delays DQS 110 to generate a sampling data strobe. In this example, control module 304 uses the sampling data strobe to store data from the shared bus in memory associated with non-volatile memory package 104-1 (e.g., in volatile memory within control module 304 and/or in non-volatile memory 302-*n*). In some implementations, the predetermined amount of delay is based on the number and location of the non-volatile memory devices sampling the data on the shared bus.

In some embodiments, reading data from the first non-volatile memory device to the shared bus includes reading (630) data from a plurality of data pages of the first non-volatile memory device; and writing the data from the plurality of data pages of the first non-volatile memory device to a single data page of the second non-volatile memory device. In some implementations, reading data from a plurality of data pages of the first non-volatile memory device includes reading particular data from each of the plurality of data pages (e.g., reading a subset of the data comprising each data page). In some implementations, reading data from a plurality of data pages of the first non-volatile memory device excludes reading data that has been flagged as being invalid (e.g., data from known-bad sectors, or data that has been updated since it was stored in the data pages). In some implementations, the entire page of data is read for each of the plurality of data pages, but only a subset of each data page is transferred to the shared bus (e.g., only a subset of each data page is stored in volatile memory and used to drive the shared bus). In some implementations, control module 304 (FIG. 3) reads data from a plurality of data pages and stores a subset of the data in volatile memory, where the subset of data corresponds to data marked as valid data (e.g., data from known-good sectors). In some implementations, the valid data corresponds to a valid data map used by a storage controller (e.g., a valid data mapping used by mapping module 528, FIG. 5).

In some embodiments, transferring the data from the shared bus to the second non-volatile memory device includes storing (632) the data in volatile memory within the second non-volatile memory device. For example, in accordance with some implementations, control module 304 (FIG. 3) stores data from the shared bus in volatile memory associated with non-volatile memory package 104-1.

In some embodiments, the shared bus couples the first non-volatile memory device to a third non-volatile memory device (in addition to the second non-volatile memory device); and, in response to receiving the data strobe at the third non-volatile memory device, the storage device transfers (634) the data from the shared bus to the third non-volatile memory device. For example, FIG. 2 shows non-volatile memory package 104-1 driving data bus 108 and DQS 110. In some implementations, non-volatile memory package 104-2 is enabled (e.g., via enable signal 204) and non-volatile memory package 104-3 is also enabled (e.g., via enable signal 206) and, as result, both packages transfer the data from data bus 108 in response to receiving DQS 110.

In some embodiments, subsequent to transferring the data from the shared bus to the second non-volatile memory device, the storage device receives (636) a program command from the controller; and, in response to the program command, the storage device writes data from an internal buffer (e.g., an internal buffer of a non-volatile memory package that includes the second non-volatile memory device) to non-volatile memory within the second non-volatile memory device. For example, in accordance with some implementations, control module 304 (FIG. 3) transfers data from the shared bus to volatile memory associated with non-volatile memory package 104-1. In this example, control module 304 receives a program command from controller 102 (FIG. 1) and, in response to the program command, writes the data stored in volatile memory to non-volatile memory (e.g., to non-volatile memory 302-1).

In alternative implementation to the one described above with respect to elements 632 and 636, as data is read from the first non-volatile memory device it is concurrently stored in the second non-volatile memory device, using the sampling data strobe at the second non-volatile memory device to sample the data and then store it to non-volatile memory within the second non-volatile memory device. In such implementations, in accordance with a determination by the storage device (see 624) that the data on the shared bus meets predefined error correction criteria, the transferred data already stored in the second non-volatile memory device is marked invalid and corrected data (e.g., produced by ECC module 514 of controller 102) is transferred to the second non-volatile memory device and written to non-volatile memory in the second non-volatile memory device to replace the initially transferred data. In some implementations, in conjunction with this remedial action, mapping module 528 updates a mapping (sometimes called a forward map or logical to physical address translation table) of the logical addresses for the transferred data to the physical addresses to which the corrected data is written.

In some embodiments, the storage device includes one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first record could be termed a second record, and, similarly, a record could be termed a first record, without changing the meaning of the description, so long as all occurrences of the "first record" are renamed consistently and all occurrences of the "second record" are renamed consistently. The first record and the second record are both records, but they are not the same record.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of transferring first data within a storage device comprising a controller and a plurality of non-volatile memory devices, the method comprising:
reading first data from a first non-volatile memory device to a shared bus;
wherein the shared bus couples the first non-volatile memory device to a second non-volatile memory device and to the controller; and
wherein the first non-volatile memory device is on a first die and the second non-volatile memory device is on a second die, distinct from the first die;
in conjunction with reading the first data from the first non-volatile memory device to the shared bus:
generating a data strobe at the first non-volatile memory device; and at the controller, determining whether the first data on the shared bus meets predefined error correction criteria, wherein the predefined error correction criteria includes determining if a quantity of errors exceeds a predetermined threshold; and in response to receiving the data strobe at the second non-volatile memory device, transferring the first data from the shared bus to an internal buffer of the second non-volatile memory device; wherein said reading, data strobe generating and transferring comprise a direct transfer of the first data from the first non-volatile memory device to the internal buffer of the second non-volatile memory device via the shared bus;

in accordance with a determination, at the controller, that the first data on the shared bus meets the predefined error correction criteria, directly transferring correction data from the controller via the shared bus to the second non-volatile memory device; and subsequent to transferring the correction data, in accordance with the transferred correction data, replacing, at the second non-volatile memory device, the first data in the internal buffer of the second non-volatile memory device with corrected data, and writing the corrected data from the internal buffer of the second non-volatile memory device to non-volatile memory within the second non-volatile memory device.

2. The method of claim 1, further comprising:
subsequent to transferring the data from the shared bus to the second non-volatile memory device, receiving a program command from the controller; and
in response to the program command, writing data from an internal buffer to non-volatile memory within the second non-volatile memory device.

3. The method of claim 1, further comprising, in conjunction with transferring the first data from the shared bus to the second non-volatile memory device, generating at the second non-volatile memory device a sampling data strobe by delaying the data strobe by a predetermined amount, and using the sampling data strobe at the second non-volatile memory device to sample the data on the shared bus.

4. The method of claim 1, wherein the shared bus couples the first non-volatile memory device to a third non-volatile memory device; and
the method further comprises, in response to receiving the data strobe at the third non-volatile memory device, transferring the data from the shared bus to the third non-volatile memory device.

5. The method of claim 1, further comprising, prior to reading data from the first non-volatile memory device to the shared bus, the controller enabling the first non-volatile memory device to perform a read operation and the controller enabling the second non-volatile memory device to perform a write operation.

6. The method of claim 1, further comprising, prior to reading data from the first non-volatile memory device to the shared bus, receiving, at the first non-volatile memory device, a read strobe command generated by the controller, wherein generating the data strobe comprises the first non-volatile memory device generating the data strobe while reading data from the first non-volatile memory device to the shared bus.

7. The method of claim 6, wherein the shared bus couples a plurality of enhanced non-volatile memory packages, each enhanced non-volatile memory package in the plurality of enhanced non-volatile memory packages comprising a plurality of non-volatile memory devices and a bus driver module;

wherein:
a first enhanced non-volatile memory package includes the first non-volatile memory device and a first bus driver module; and
a second enhanced non-volatile memory package includes the second non-volatile memory device and a second bus driver module; and
wherein the second bus driver module delays the data strobe by a predetermined amount.

8. The method of claim 1, wherein reading data from the first non-volatile memory device to the shared bus comprises reading a page of data from the first non-volatile memory device to the shared bus.

9. The method of claim 1, wherein reading data from the first non-volatile memory device to the shared bus comprises reading data from a plurality of data pages of the first non-volatile memory device; and
the method further comprises writing the data from the plurality of data pages of the first non-volatile memory device to a single data page of the second non-volatile memory device.

10. The method of claim 1, wherein transferring the data from the shared bus to the second non-volatile memory device comprises storing the data in volatile memory within the second non-volatile memory device.

11. The method of claim 1, wherein the first non-volatile memory device drives the shared bus.

12. A method of transferring first data within a storage device comprising a controller and a plurality of non-volatile memory devices, the method comprising:
reading first data from a first non-volatile memory device to a shared bus;
wherein the shared bus couples the first non-volatile memory device to a second non-volatile memory device and to the controller; and
wherein the first non-volatile memory device is on a first die and the second non-volatile memory device is on a second die, distinct from the first die;
in conjunction with reading the first data from the first non-volatile memory device to the shared bus:
generating a data strobe at the first non-volatile memory device; and
in response to receiving the data strobe at the second non-volatile memory device, transferring the first data from the shared bus to an internal buffer of the second non-volatile memory device;
while reading data from the first non-volatile memory device to the shared bus,
reading second data from a fourth non-volatile memory device to a second shared bus, wherein the second shared bus couples the fourth non-volatile memory device to the controller and to a fifth non-volatile memory device;
generating a second data strobe at the fourth non-volatile memory device; and
in response to receiving the second data strobe at the fifth non-volatile memory device, transferring the second data from the second shared bus to the fifth non-volatile memory device.

13. A storage device operable to perform atomic data transfers, comprising:
a controller;
a plurality of memory die each comprising a plurality of non-volatile memory devices; and
a shared bus coupling the plurality of non-volatile memory die and the controller, the storage device configured to:

read first data from a first non-volatile memory device on a first memory die to the shared bus;

in conjunction with reading the first data from the first non-volatile memory device to the shared bus:
  generate a data strobe at the first non-volatile memory device;
  at the controller, determine whether the first data on the shared bus meets predefined error correction criteria, wherein the predefined error correction criteria includes determining if a quantity of errors exceeds a predetermined threshold; and in response to receiving the data strobe at a second non-volatile memory device on a second memory die, transfer the first data from the shared bus to an internal buffer of the second non-volatile memory device, wherein the second memory die is distinct from the first memory die; wherein said reading, data strobe generating and transferring comprise a direct transfer of the first data from the first non-volatile memory device to the internal buffer of the second non-volatile memory device via the shared bus;

in accordance with a determination, at the controller, that the first data on the shared bus meets the predefined error correction criteria, directly transfer correction data from the controller via the shared bus to the second non-volatile memory device; and subsequent to transferring the correction data, in accordance with the transferred correction data, replace, at the second non-volatile memory device, the first data in the internal buffer of the second non-volatile memory device with corrected data, and write the corrected data from the internal buffer of the second non-volatile memory device to non-volatile memory within the second non-volatile memory device.

14. The storage device of claim 13, the storage device further configured to:
  subsequent to transferring the data from the shared bus to the second non-volatile memory device, receive a program command from the controller; and
  in response to the program command, write data from an internal buffer to non-volatile memory within the second non-volatile memory device.

15. The storage device of claim 13, the storage device further configured to, in conjunction with transferring the first data from the shared bus to the second non-volatile memory device, generate at the second non-volatile memory device a sampling data strobe by delaying the data strobe by a predetermined amount, and use the sampling data strobe at the second non-volatile memory device to sample the data on the shared bus.

16. The storage device of claim 13, wherein the shared bus couples the first non-volatile memory device to a third non-volatile memory device; and
  the storage device is further configured to, in response to receiving the data strobe at the third non-volatile memory device, transfer the data from the shared bus to the third non-volatile memory device.

17. The storage device of claim 13, the storage device further configured to, prior to reading data from the first non-volatile memory device to the shared bus, receive, at the first non-volatile memory device, a read strobe command generated by the controller, wherein generating the data strobe comprises the first non-volatile memory device generating the data strobe while reading data from the first non-volatile memory device to the shared bus.

18. A non-transitory computer-readable storage medium storing one or more programs for execution by one or more processors of a storage device comprising a controller and a plurality of non-volatile memory device, the one or more programs including instructions for:
  reading first data from a first non-volatile memory device to a shared bus;
    wherein the shared bus couples the first non-volatile memory device to a second non-volatile memory device and to the controller; and
    wherein the first non-volatile memory device is on a first die and the second non-volatile memory device is on a second die, distinct from the first die;
  in conjunction with reading the first data from the first non-volatile memory device to the shared bus:
    generating a data strobe at the first non-volatile memory device; and
    at the controller, determining whether the first data on the shared bus meets predefined error correction criteria, wherein the predefined error correction criteria includes determining if a quantity of errors exceeds a predetermined threshold; and
  in response to receiving the data strobe at the second non-volatile memory device, transferring the first data from the shared bus to an internal buffer of the second non-volatile memory device; wherein said reading, data strobe generating and transferring comprise a direct transfer of the first data from the first non-volatile memory device to the internal buffer of the second non-volatile memory device via the shared bus;
  in accordance with a determination, at the controller, that the first data on the shared bus meets the predefined error correction criteria, directly transferring correction data from the controller via the shared bus to the second non-volatile memory device; and
  subsequent to transferring the correction data, in accordance with the transferred correction data, replacing, at the second non-volatile memory device, the first data in the internal buffer of the second non-volatile memory device with corrected data, and writing the corrected data from the internal buffer of the second non-volatile memory device to non-volatile memory within the second non-volatile memory device.

19. The storage medium of claim 18, the one or more programs further including instructions for:
  subsequent to transferring the data from the shared bus to the second non-volatile memory device, receiving a program command from the controller; and
  in response to the program command, writing data from an internal buffer to non-volatile memory within the second non-volatile memory device.

20. The storage medium of claim 18, the one or more programs further including instructions for, in conjunction with transferring the first data from the shared bus to the second non-volatile memory device, generating at the second non-volatile memory device a sampling data strobe by delaying the data strobe by a predetermined amount, and using the sampling data strobe at the second non-volatile memory device to sample the data on the shared bus.

21. The storage medium of claim 18, wherein the shared bus couples the first non-volatile memory device to a third non-volatile memory device; and
  the one or more programs further include instructions for, in response to receiving the data strobe at the third non-volatile memory device, transferring the data from the shared bus to the third non-volatile memory device.

22. The storage medium of claim 18, the one or more programs further including instructions for, prior to reading data from the first non-volatile memory device to the shared bus, receiving, at the first non-volatile memory device, a read strobe command generated by the controller, wherein generating the data strobe comprises the first non-volatile memory device generating the data strobe while reading data from the first non-volatile memory device to the shared bus.

* * * * *